United States Patent
Li et al.

(10) Patent No.: US 11,177,326 B2
(45) Date of Patent: Nov. 16, 2021

(54) METHOD OF PATTERNING FILM, DISPLAY DEVICE WITH PATTERNED FILM AND METHOD FOR PREPARING THE SAME

(71) Applicant: BOE Technology Group Co., Ltd., Beijing (CN)

(72) Inventors: Dong Li, Beijing (CN); Yuanming Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 66 days.

(21) Appl. No.: 16/628,812

(22) PCT Filed: Apr. 30, 2019

(86) PCT No.: PCT/CN2019/085234
§ 371 (c)(1),
(2) Date: Jan. 6, 2020

(87) PCT Pub. No.: WO2019/228128
PCT Pub. Date: Dec. 5, 2019

(65) Prior Publication Data
US 2020/0203436 A1    Jun. 25, 2020

(30) Foreign Application Priority Data
May 29, 2018    (CN) .......................... 201810532362.3

(51) Int. Cl.
*H01L 27/32* (2006.01)
*H01L 51/00* (2006.01)
*H01L 51/50* (2006.01)

(52) U.S. Cl.
CPC .......... *H01L 27/322* (2013.01); *H01L 51/003* (2013.01); *H01L 51/0097* (2013.01); *H01L 51/502* (2013.01)

(58) Field of Classification Search
USPC .......................................... 438/29
See application file for complete search history.

(56) References Cited

U.S. PATENT DOCUMENTS 7,309,958 B2 * 12/2007 Kim .................... H01L 27/3262
313/506
9,818,940 B2   11/2017 Cheng et al.
(Continued)

FOREIGN PATENT DOCUMENTS

CN    205194223 U    4/2016
CN    105679799 A    6/2016
(Continued)

OTHER PUBLICATIONS

First Office Action, including Search Report, for Chinese Patent Application No. 201810532362.3, dated Jun. 25, 2019, 11 pages.

*Primary Examiner* — Nduka E Ojeh
(74) *Attorney, Agent, or Firm* — Westman, Champlin & Koehler, P.A.

(57) ABSTRACT

A method of patterning a film, a display device and a method for preparing the same. The method of patterning a film includes preparing a magnetic substrate by forming a magnetic material pattern within a flexible substrate; disposing a film to be processed and a first rigid substrate opposite to and spaced apart from each other, and placing the magnetic substrate against a surface of the film to be processed at a side thereof facing away from the first rigid substrate; pushing a portion of the film to be processed corresponding to the magnetic material pattern to project towards and to attach onto the first rigid substrate, by the magnetic material pattern via a magnetic effect of a magnetic force of a magnetic field which is applied onto the magnetic substrate; and forming a patterned film on the first rigid substrate.

14 Claims, 4 Drawing Sheets

(56) References Cited

U.S. PATENT DOCUMENTS

| | | | |
|---|---|---|---|
| 2006/0148114 A1* | 7/2006 | Yotsuya | H01L 21/6831 438/29 |
| 2009/0244749 A1* | 10/2009 | Nishida | G11B 5/865 360/17 |
| 2010/0148407 A1 | 6/2010 | Park et al. | |
| 2014/0256078 A1* | 9/2014 | Jin | B28D 5/00 438/57 |
| 2017/0213975 A1 | 7/2017 | Cheng et al. | |
| 2017/0309868 A1* | 10/2017 | Ahn | H01L 51/56 |
| 2018/0226609 A1* | 8/2018 | Li | H01L 51/0097 |
| 2020/0203436 A1 | 6/2020 | Li et al. | |
| 2020/0279826 A1* | 9/2020 | Cho | H01L 25/0753 |

FOREIGN PATENT DOCUMENTS

| | | |
|---|---|---|
| CN | 105870327 A | 8/2016 |
| CN | 106206610 A | 12/2016 |
| CN | 108022829 A | 5/2018 |
| CN | 108735919 A | 11/2018 |
| JP | 2010000419 A | 1/2010 |
| KR | 20110128579 A | 11/2011 |

\* cited by examiner

METHOD OF PATTERNING FILM, DISPLAY DEVICE WITH PATTERNED FILM AND METHOD FOR PREPARING THE SAME

CROSS-REFERENCE TO RELATED INVENTION

This application is a Section 371 National Stage Application of International Application No. PCT/CN2019/085234, filed on Apr. 30, 2019, entitled "METHOD OF PATTERNING FILM, DISPLAY DEVICE AND METHOD FOR PREPARING THE SAME", which claims priority to Chinese Patent Application Invention No. 201810532362.3 filed on May 29, 2018 in the China National Intellectual Property Administration, the whole disclosure of which is incorporated herein by reference.

BACKGROUND OF THE DISCLOSURE

Field of the Disclosure

Embodiments of the present disclosure generally relate to the technical field of display technology, and in particular, to a method of patterning a film, a display device and a method for preparing the same.

Description of the Related Art

Currently, the method of patterning a film typically comprises etching, transferring, and the like. Etching may typically result in a residue of a portion of film material; specifically, in a condition that etching is applied onto a light-emitting layer in the technical field of display technology, a residue of material during a process of patterning may influence purity of pixels, and in turn influence display effect. And as far as transferring is concerned, it has a relatively large number of process steps, and is complex in operation.

SUMMARY OF THE DISCLOSURE

The embodiments of the present disclosure have been made to overcome or alleviate at least one aspect of the above mentioned disadvantages and/or shortcomings in the relevant art, by providing a method of patterning a film, a display device and a method for preparing the same.

Following technical solutions are adopted in exemplary embodiments of the disclosure.

According to one aspect of embodiments of the disclosure, there is provided a method of patterning a film, comprising: preparing a magnetic substrate by forming a magnetic material pattern within a flexible substrate; disposing a film to be processed and a first rigid substrate opposite to and spaced apart from each other, and placing the magnetic substrate against a surface of the film to be processed at a side thereof facing away from the first rigid substrate; pushing a portion of the film to be processed corresponding to the magnetic material pattern to project towards and to attach onto the first rigid substrate, by the magnetic material pattern via a magnetic effect of a magnetic force of a magnetic field which is applied onto the magnetic substrate; and forming a patterned film on the first rigid substrate, by removing the magnetic field and removing both the magnetic substrate and a portion of the film to be processed which is not pushed to project towards the first rigid substrate.

According to embodiments of the disclosure, forming the magnetic material pattern within the flexible substrate comprises: forming a first flexible film on a surface of a second rigid substrate at a side thereof; forming the magnetic material pattern on a surface of the first flexible film at a side thereof facing away from the second rigid substrate; forming a second flexible film on both a portion of the surface of the first flexible film at the side thereof facing away from the second rigid substrate which is not covered by the magnetic material pattern, and a portion of a surface of the magnetic material pattern at a side thereof facing away from the second rigid substrate, the second flexible film covering the magnetic material pattern; and peeling off the second rigid substrate from the first flexible film.

According to embodiments of the disclosure, a material which forms the flexible substrate is selected from at least one of polydimethylsiloxane and polyethylene terephthalate.

According to embodiments of the disclosure, a material which forms the magnetic material pattern is selected from at least one of iron, ferroalloy, iron containing compound, nickel, nickel alloy, cobalt, cobalt alloy, nickel containing compound or cobalt containing compound.

According to embodiments of the disclosure, a material which forms the film to be processed is quantum dot material.

According to embodiments of the disclosure, the magnetic field is a uniform magnetic field.

According to embodiments of the disclosure, when the magnetic field is applied onto the magnetic substrate, a way in which an intensity of the magnetic field changes is one of following: the intensity of the magnetic field increases gradiently with a time as the magnetic field is applied, or the intensity of the magnetic field increases linearly with a time as the magnetic field is applied.

According to embodiments of the disclosure, when the magnetic field is being removed, a way in which an intensity of the magnetic field changes is one of following: the intensity of the magnetic field decreases gradiently with a time as the magnetic field is applied, or the intensity of the magnetic field decreases linearly with a time as the magnetic field is applied.

According to embodiments of the disclosure, first active groups are provided at a surface of the film to be processed proximal to the first rigid substrate, and second active groups are provided at a surface of the first rigid substrate proximal to the film to be processed; and in a condition that a distance between the film to be processed and the first rigid substrate is decreased below a threshold distance, an attraction effect exists between the first active groups and the second active groups.

According to embodiments of the disclosure, prior to removal of the magnetic substrate, the method further comprises a step in which the portion of the film to be processed corresponding to the magnetic material pattern and the first rigid substrate are processed by at least one of pressurization and heating.

According to another aspect of the exemplary embodiment of the present disclosure, there is provided a method of preparing a display device, comprising steps of preparing a patterned film by using the method as above.

According to embodiments of the disclosure, a material which forms the patterned film is quantum dot material, and the patterned film forms a light-emitting layer of the display device.

According to embodiments of the disclosure, a material which forms the patterned film is quantum dot material, and the patterned film forms a color filter of the display device.

According to another aspect of the exemplary embodiment of the present disclosure, there is provided a display device, which is prepared by the method as above.

BRIEF DESCRIPTION OF THE DRAWINGS

The above and other features and advantages of embodiments of the disclosure will be apparent through the following detailed description of the embodiments of the disclosure with reference to the drawings, facilitating obtaining a comprehensive understanding of the embodiments of the disclosure.

DETAILED DESCRIPTION OF PREFERRED EMBODIMENTS OF THE INVENTION

A technical solution of embodiments of the present disclosure will be further described hereinafter through the embodiments with reference to the accompanying drawings. In the specification, same or similar reference numerals indicate same or similar parts. The following description of embodiments of the present disclosure with reference to the accompanying drawings is intended to explain a general inventive concept of the present disclosure, and shall not be construed as a limitation of the present disclosure.

In addition, in the following detailed description, for the convenience of explanation, many specific details are set forth to provide a comprehensive understanding of the present disclosure embodiment. However, it is apparent that, one or more embodiments are also implemented, for example, without these specific details. In other cases, well-known structures and devices are illustrated to simplify the accompanying drawings.

Dimensions and shapes of components in the drawings only intend to illustrate the content of the present disclosure, rather than reflecting true scale of the display device according to the embodiment of the present disclosure.

Figure 1:
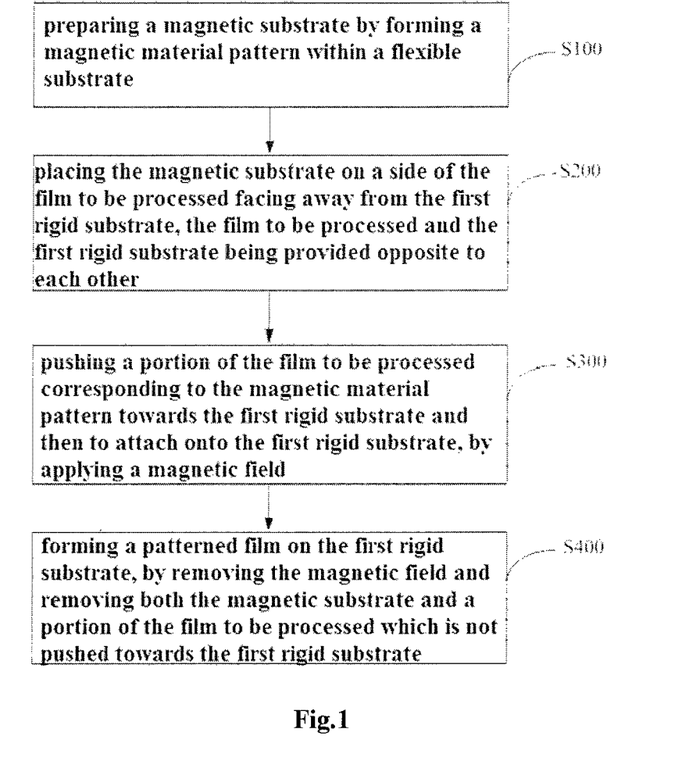
FIG. 1 illustrates a schematic flow chart of a method of patterning a film according to some embodiments of the disclosure.
Figure 2A:
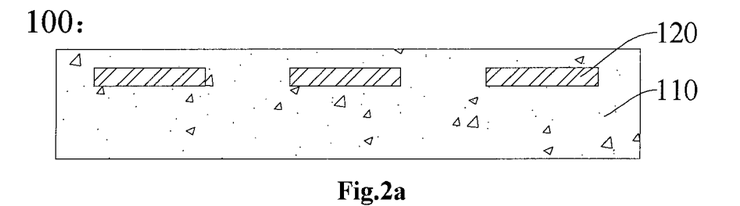
FIGS. 2a, 2b, 2c and 2d illustrate structural schematic views of respective structures generated in various steps in the work procedure of a method of patterning a film, according to some other embodiments of the disclosure.
Figure 2B:
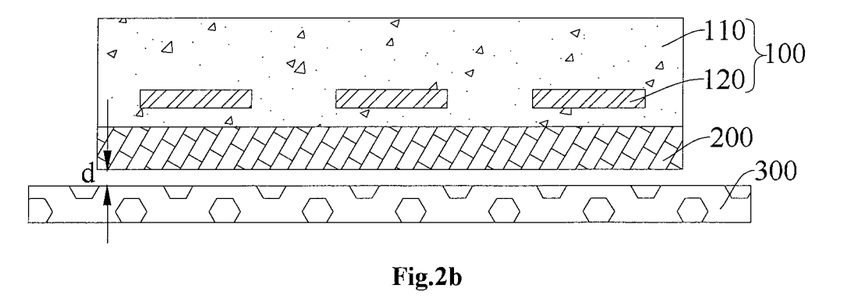

In one aspect of the embodiments of the present disclosure, according to a general technical concept of embodiments of the present disclosure, a method for patterning a film is provided. According to the embodiments of the present disclosure, as illustrated in FIG. 1, FIG. 2a and FIG. 2d, the method of patterning the film comprises the following steps:

S100: preparing a magnetic substrate 100 by forming a magnetic material pattern 120 within a flexible substrate 110. A structural schematic view of a structure generated in this step is illustrated in FIG. 2a.

Specifically, a limitation "magnetic substrate" herein is defined as a substrate which is formed to have (e.g., embedded with) a magnetic material pattern therein, rather than a substrate which is entirely formed by a magnetic material.

According to embodiments of the present disclosure, a specific type of the material which forms the flexible substrate 110 may for example comprise polydimethylsiloxane (i.e., PDMS), polyethylene terephthalate (i.e., PET), or the like, but being not limited thereto. In some embodiments of the present disclosure, a specific material which forms the flexible substrate 110 is for example PDMS. As such, the specific material which forms the flexible substrate 110 has a wide range of sources, is easy to obtain, and has a relatively low cost; and since surfaces of polymer molecules of PDMS contain a large number of siloxy groups, it facilitates an application exploiting inherent/intrinsic characteristics of siloxy groups in subsequent steps of the method of patterning the film.

According to embodiments of the present disclosure, a thickness of the flexible substrate 110 is, for example, 500~2000 microns. In some specific embodiments of the present disclosure, the thickness of the flexible substrate 110 is, for example, 500 microns, 1000 microns, 1500 microns, or 2000 microns. Therefore, the thickness of the flexible substrate 110 is relatively moderate; and then, by applying a magnetic force onto a magnetic material of the magnetic material pattern within the flexible substrate 110, at least one surface of the flexible substrate 110 may be deformed without any external direct contact force, so as to facilitate a deformation of the film to be processed and then to form a patterned film, in subsequent steps.

According to embodiments of the present disclosure, a material which forms the magnetic material pattern 120 is a magnetoconductive (i.e., magnetically conductive) material, for example comprises a metallic magnetoconductive material, more specifically, such as iron, ferroalloy, iron containing compound, nickel, nickel alloy, cobalt, cobalt alloy, nickel containing compound or cobalt containing compound, and the like. In some embodiments of the present disclosure, specifically, the material which forms the magnetic material pattern 120 is for example ferroferric oxide (i.e., $Fe_3O_4$). As such, the specific material which forms the magnetic material pattern 120 has a wide range of sources, is easy to obtain, and has a relatively low cost and a superior magnetic conductivity/permeability, it facilitates an application of the subsequent steps in the method of patterning the film.

According to embodiments of the present disclosure, by way of example, those skilled in the art may set a patterned shape of the magnetic material pattern 120 arbitrarily, as required in practice. Therefore, the method of patterning the film is applicable to various different fields and has a wide range of applications. In some embodiments of the present disclosure, for example, a light-emitting layer or a color filter located in a display device is prepared by this method; in such a condition, specific shape and size of the magnetic material pattern may be determined to be consistent with the shape and size of the light-emitting layer or the color filter to be formed in the display device.

According to embodiments of the present disclosure, a thickness of the magnetic material pattern 120 is, for example, 50~200 microns. In some specific embodiments of the present disclosure, the thickness of the magnetic material pattern 120 is, for example, 50 microns, 100 microns, 150 microns, 200 microns. As such, the thickness of the magnetic material pattern 120 is relatively moderate as compared with the thickness of the flexible substrate 110 in which the magnetic material pattern 120 is wrapped/surrounded, and a sufficient magnetic force may be generated by utilizing the magnetic field so as to deform at least one surface of the flexible substrate 110, without any contact force directly applied thereon, avoiding any influence of the contact force on a softness or compliance of the flexible substrate 110.

Figure 3:
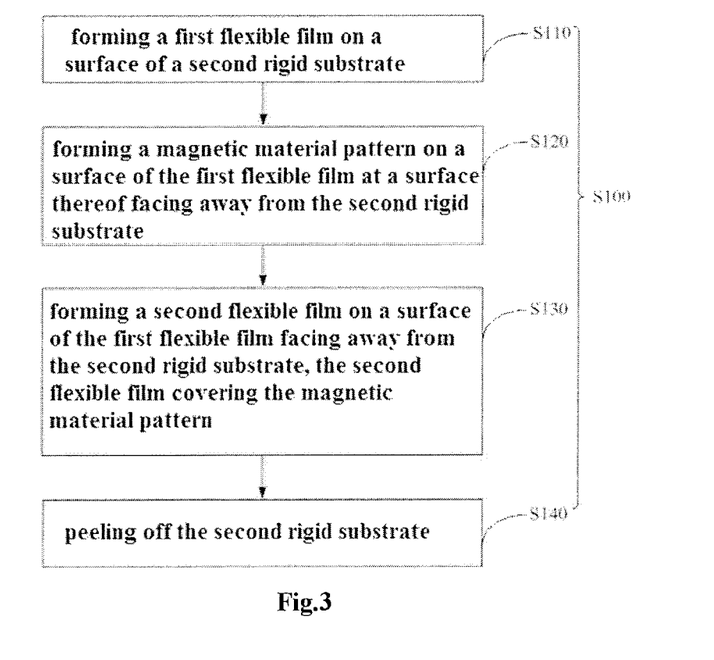
FIG. 3 illustrates a schematic flow chart of specific sub-steps of a step S100 in the method of patterning a film, according to embodiments of the disclosure.
Figure 4A:
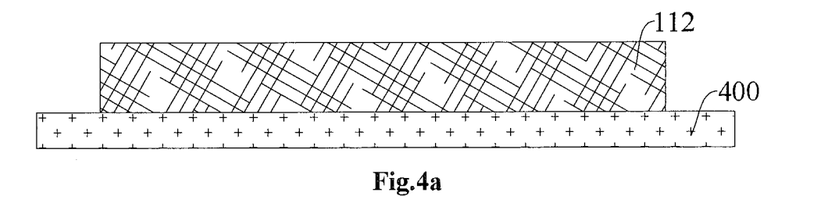
FIGS. 4a, 4b, 4c and 4d illustrate structural schematic views of respective structures generated in various specific sub-steps of the step S100 in the method of patterning a film, according to some other embodiments of the disclosure.

In some embodiments of the present disclosure, as illustrated in FIG. 3, and in combination with the structural schematic views of respective structures generated in various steps in the specific work procedure of the step S100 as illustrated in FIGS. 4*a*, 4*b*, 4*c* and 4*d*, the step of "preparing a magnetic substrate 100 by forming a magnetic material pattern 120 within a flexible substrate 110" for example specifically comprises following sub-steps:

S110: forming a first flexible film 112 on a surface of a second rigid substrate 400 at a side thereof. A structural schematic view of a structure generated in this sub-step is illustrated in FIG. 4*a*.

According to embodiments of the present disclosure, a specific type of the material which forms the second rigid substrate 400 may for example comprise glass, metal, polymer, or the like. As such, the second rigid substrate 400 has relatively superior mechanical properties such as resistance to flexure and mechanical stiffness, thus providing a relatively superior supporting effect on the flexible film 112 located thereon.

According to embodiments of the present disclosure, a thickness of the second rigid substrate 400 is, for example, 500~2000 microns. In some specific embodiments of the present disclosure, the thickness of the second rigid substrate 400 is, for example, 500 microns, 1000 microns, 1500 microns, or 2000 microns. Therefore, the thickness of the second rigid substrate 400 and the thickness of the flexible substrate 110 to be formed thereon match each other, i.e., they are essentially on the same order of magnitude, and are the same as or similar to each other, such that the second rigid substrate 400 has a proper rigidity, may not readily be broken or may not readily bend at a relatively large level.

According to embodiments of the present disclosure, a specific type of the material which forms the first flexible film 112 may for example comprise PDMS, PET, or the like, but being not limited thereto. In some embodiments of the present disclosure, a specific material which forms the first flexible film 112 is for example PDMS. As such, the specific material which forms the first flexible film 112 has a wide range of sources, is easy to obtain, and has a relatively low cost; and since surfaces of polymer molecules of PDMS contain a large number of siloxy groups, it facilitates an application exploiting inherent/intrinsic characteristics of siloxy groups in subsequent steps of the method of patterning the film.

According to embodiments of the present disclosure, a thickness of the first flexible film 112 is, for example, 250~1000 microns. In some specific embodiments of the present disclosure, the thickness of the first flexible film 112 is, for example, 250 microns, 500 microns, 750 microns, or 1000 microns. Therefore, the thickness of the first flexible film 112 is relatively moderate as compared with the thickness of the second rigid substrate 400 on which the first flexible film 112 is located, facilitating subsequent application.

According to embodiments of the present disclosure, a specific process of forming the first flexible film 112 on one surface of the second rigid substrate 400 at a side thereof may for example be coating, ink-jet printing, physical vapor deposition, chemical vapor deposition, or the like. Therefore, it is simple, convenient in operation, and is easy to implement.

Figure 4B:
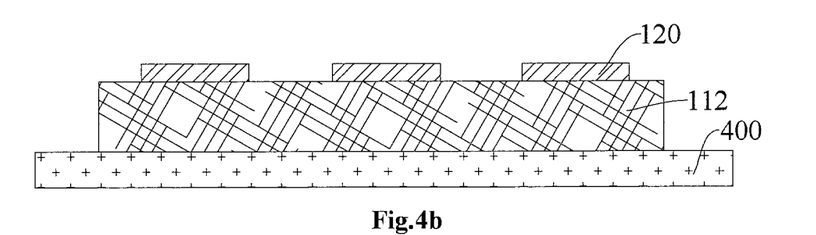

S120: forming the magnetic material pattern 120 on a surface of the first flexible film 112 at a side thereof facing away from the second rigid substrate 400. A structural schematic view of a structure generated in this sub-step is illustrated in FIG. 4*b*.

According to embodiments of the present disclosure, the material which forms the magnetic material pattern 120, the specific shape and the specific size of the magnetic material pattern 120 may be the same as those described above, and will not be repeated excessively herein.

According to embodiments of the present disclosure, specific processes of forming the magnetic material pattern 120 on the surface of the first flexible film 112 at the side thereof facing away from the second rigid substrate 400 may for example be: above all, growing a magnetic material film on the surface of the first flexible film 112 facing away from the second rigid substrate 400; and then, processing the magnetic material film by exposure, development, etching, peeling off, etc., facilitating implementation of a patterning of the magnetic material film, that is to say, forming the magnetic material pattern 120. Therefore, it is simple, convenient in operation, and is easy to implement, with a low cost.

Figure 4C:
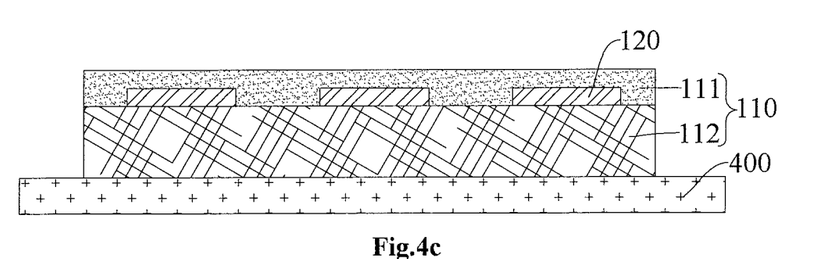

S130: forming a second flexible film 111 on both a portion of the surface of the first flexible film 112 at the side thereof facing away from the second rigid substrate 400 which is not covered by the magnetic material pattern, and a portion of a surface of the magnetic material pattern 120 at a side thereof facing away from the second rigid substrate 400, the second flexible film 111 covering the magnetic material pattern 120. A structural schematic view of a structure generated in this sub-step is illustrated in FIG. 4*c*.

According to embodiments of the present disclosure, a specific process of forming the second flexible film 111 may for example coating, inkjet printing, physical vapor deposition, chemical vapor deposition, or the like. Therefore, it is simple, convenient in operation, and is easy to implement.

According to embodiments of the present disclosure, a specific type of the material which forms the second flexible film 111 may for example comprise PDMS, PET, or the like, but being not limited thereto. In some embodiments of the present disclosure, a specific material which forms the second flexible film 111 is for example PDMS. As such, the specific material which forms the second flexible film 111 has a wide range of sources, is easy to obtain, and has a relatively low cost; and since surfaces of polymer molecules of PDMS contain a large number of siloxy groups, it facilitates an application exploiting inherent/intrinsic characteristics of siloxy groups in subsequent steps of the method of patterning the film.

According to embodiments of the present disclosure, a thickness of the second flexible film 111 is, for example, 250~1000 microns. In some specific embodiments of the present disclosure, the thickness of the second flexible film 111 is, for example, 250 microns, 500 microns, 750 microns, or 1000 microns. Therefore, the thickness of the second flexible film 111 is relatively moderate, facilitating subsequent application.

According to embodiments of the present disclosure, for example, more specifically, the first flexible film 112 and the second flexible film 111 are respectively formed by one and the same material which is selected from, for example, a group comprising PDMS, PET, or the like, but being not limited thereto. As such, the first flexible film 112 and the second flexible film 111 cooperate with each other to form collectively the flexible substrate 110 which wraps/surrounds the magnetic material pattern 120. As such, the magnetic material pattern 120 is surrounded, delimited and defined in the flexible substrate 110, with a simple and convenient operation at a low cost, and is easy to implement and is readily produced in industrialization.

Figure 4D:
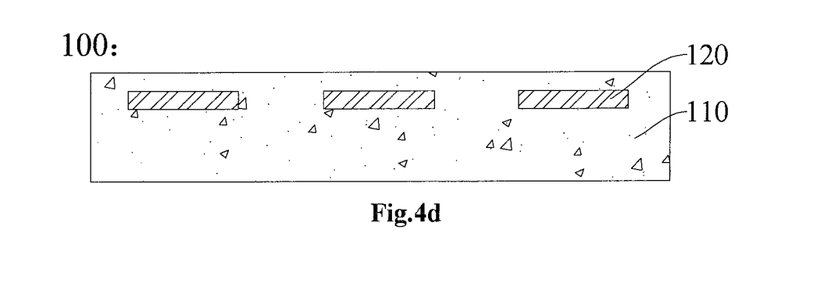

S140: peeling off the second rigid substrate 400 from the first flexible film 112 (i.e. from the flexible substrate 110 formed as above). A structural schematic view of a structure generated in this sub-step is illustrated in FIG. 4d.

According to embodiments of the present disclosure, a specific process of peeling off the second rigid substrate 400 is for example: laser peeling-off, mechanical peeling-off, ultrasonic peeling-off, or the like. Therefore, it is simple, convenient in operation, and is easy to implement and is readily produced in industrialization.

After above steps, the magnetic substrate 100 is obtained, that is, the magnetic substrate 100 is formed collectively by both the flexible substrate 110 and the magnetic material pattern 120 which is surrounded and delimited within the flexible substrate 110. According to embodiments of the present disclosure, as illustrated in FIG. 1, after the magnetic substrate 100 is obtained, the method of patterning the film further comprises following steps:

S200: disposing a film 200 to be processed and a first rigid substrate 300 opposite to and spaced apart from each other, and placing the magnetic substrate 100 against a surface of the film 200 to be processed at a side thereof facing away from the first rigid substrate 300. The film 200 to be processed and the first rigid substrate 300 are provided opposite to and spaced apart from each other, and are to be abut against each other later. A structural schematic view of a structure generated in this step is illustrated in FIG. 2b.

According to embodiments of the present disclosure, a material which forms the film 200 to be processed comprises quantum dots (i.e., a quantum dot material), or the like, but being not limited thereto. In some embodiments of the present disclosure, a specific type of material which forms the film 200 to be processed, for example, specifically comprises elements IV, II-VI, IV-VI or III-V, such as silicon quantum dots, germanium quantum dots, cadmium sulfide quantum dots, cadmium selenide quantum dots, cadmium telluride quantum dots, zinc selenide quantum dots, lead sulfide quantum dots, lead selenide quantum dots, indium phosphide quantum dots, and indium arsenide quantum dots, and the like, but not being limited thereto. Therefore, this method is typically used to prepare the light-emitting layer, the color filter, and the like of the display device, intending to effectively overcome problems in relevant art such as complex operation, relatively cumbersome steps, and material residue and the like.

According to embodiments of the present disclosure, a thickness of the film 200 to be processed is, for example, 10~2000 nm. In some specific embodiments of the present disclosure, the thickness of the film 200 to be processed is, for example, 10 nm, 100 nm, 500 nm, 1000 nm, 1500 nm, or 2000 nm. Therefore, the thickness of the film 200 to be processed is relatively moderate as compared with the thickness of the flexible substrate 110 in which the magnetic material pattern 120 is wrapped/surrounded, and a portion of the film 200 to be processed corresponding to the magnetic material pattern 120 (here, "correspond(s) to" or "corresponding to" as hereinafter means that, for example, at least partially align with each other, or their respective orthogonal projections on the first rigid substrate 300 at least partially overlap each other) may readily be separated from other portion of the film 200 to be processed; and when the patterned film is used as the light-emitting layer of the display device, it may meet requirements in practical use of light-emitting, facilitating an application thereof in subsequent steps.

According to embodiments of the present disclosure, a specific type of material which forms the first rigid substrate 300 is, for example, glass, metal, ceramic, polymer, or the like. As such, the first rigid substrate 300 has relatively superior mechanical properties such as resistance to flexure, and mechanical stiffness, thus providing a relatively superior supporting effect on the film 200 to be processed which is located thereon. In some embodiments of the present disclosure, when preparing the light-emitting layer or the color filter of the display device by the method, the first rigid substrate is for example a substrate on which a relevant driving circuit structure (such as a thin film transistor, a connecting circuit, and the like) has been prepared; or alternatively, a glass substrate or a polymer substrate for forming a color film substrate functions as the first rigid substrate According to embodiments of the present disclosure, a thickness of the first rigid substrate 300 is, for example, 300-700 microns. In some specific embodiments of the present disclosure, the thickness of the first rigid substrate 300 is, for example, 300 microns, 400 microns, 500 microns, 600 microns, 700 microns. As such, the thickness of the first rigid substrate 300 may satisfy requirements of various processes such as forming the driving circuit and the like, and may control the deformation and light transmittance of the substrate as previously formed.

According to embodiments of the present disclosure, as illustrated in FIG. 2b, a distance d between the film 200 to be processed and the first rigid substrate 300 is, for example, 50~200 microns. In some specific embodiments of the present disclosure, the distance between the film 200 to be processed and the first rigid substrate 300 provided opposite to and spaced apart from each other, is for example specifically 50 microns, 100 microns, 150 microns, 200 microns. Therefore, within a range of the distance, a patterned portion (i.e., the portion corresponding to the magnetic material pattern) of the film to be processed may be significantly separated from a non-patterned portion (a portion which is not corresponding to the magnetic material pattern) of the film to be processed in a later step (for example, step S300 as below), for example by the magnetic force, and the patterned portion may therefore be effectively pushed towards the first rigid substrate, even for example against the first rigid substrate, for example; as such, a setting of such a distance facilitates an application based on the range of the distance over which the magnetic force may act, in the subsequent steps of the method of patterning the film.

S300: pushing a portion of the film 200 to be processed corresponding to the magnetic material pattern 120 to project towards and to attach onto the first rigid substrate 300, by the magnetic material pattern via an magnetic effect of a magnetic force of a magnetic field which is applied onto the magnetic substrate 100. A structural schematic view of a structure generated in this step is illustrated in FIG. 2c.

Figure 2C:
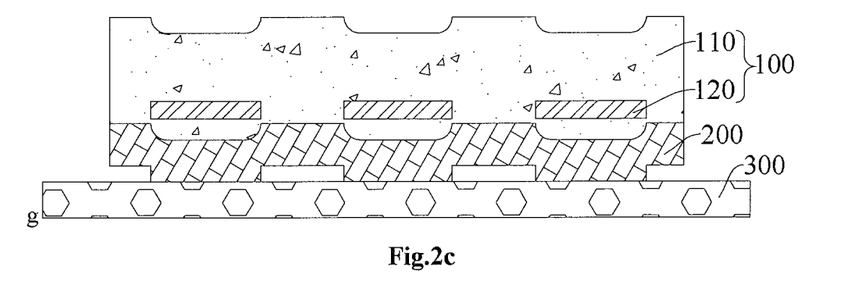
Figure 2D:
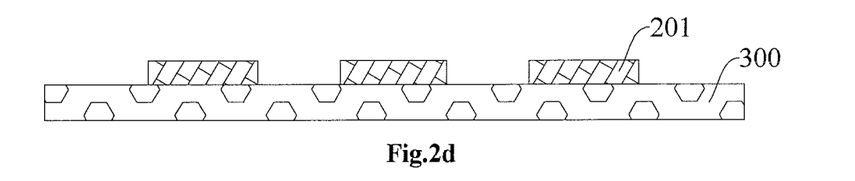

According to embodiments of the present disclosure, aforementioned limitation "a portion of the film 200 to be processed corresponding to the magnetic material pattern 120" refers to the portion of the film 200 to be processed that is at least partially aligned with (substantially aligned with each other as shown in FIG. 2c) the magnetic material pattern 120, as illustrated; in other words, an orthogonal projection of the portion of the film 200 to be processed on the first rigid substrate 300 and an orthographic projection of the magnetic material pattern 120 on the first rigid substrate 300 at least partially overlap each other (substantially overlap each other as illustrated in FIG. 2c). When the magnetic material pattern 120 pushes the portion of the film 200 to be processed corresponding to the magnetic material pattern 120, integrally to displace, towards the first rigid substrate 300, by the magnetic force, then, there occurs a mismatch (i.e., dislocation) between a portion of the film 200 to be processed which is not pushed towards the first rigid substrate 300 and the portion of the film 200 to be processed which is pushed towards the first rigid substrate 300, due to a tensile stretch existing therebetween; therefore, an interface therebetween is subjected to a shearing action resulting from the tensile stretch. As such, van der Waals forces between respective molecules (i.e., intermolecular van der Waals forces) of the portion of the film 200 to be processed which is not pushed towards the first rigid substrate 300 and the portion of the film 200 to be processed which is pushed towards the first rigid substrate 300 at the interface may decrease gradually, and accordingly, distances among molecules (i.e., intermolecular distances) may increase gradually, and the van der Waals forces between respective molecules of above two portions of the film 200 to be processed at the interface therebetween may drop below a critical value of the van der Waals forces which is minimal as required for maintaining the interface in a stable condition; in other words, these two portions of the film 200 to be processed break apart to separate from each other, after distances between respective molecules of the two portions of the film 200 to be processed at the interface exceed a critical value of the distances between respective molecules of the two portions of the film 200 to be processed which is minimal as required for maintaining the interface in a stable condition. As such, the portion of the film 200 to be processed corresponding to the magnetic material pattern 120 is pushed to project towards the first rigid substrate 300 from the flexible substrate 110 and in turn to attach onto the first rigid substrate 300. More specifically, once the portion of the pending film 200 corresponding to the magnetic material pattern 120 has been attached to the first rigid substrate 300, at that moment, since the portion of the film 200 to be processed corresponding to the magnetic material pattern 120 is pushed towards the first rigid substrate 300 and displaced, then, a portion of the film 200 to be processed at a side thereof facing away from the first rigid substrate 300 is concave towards the first rigid substrate 300 (e.g., a volume of this concave portion of the film 200 to be processed is substantially the same as a volume of a respective portion of the magnetic material pattern 120 to which this concave portion corresponds); and moreover, a portion of the film 200 to be processed at a side thereof facing towards the first rigid substrate 300 is convex towards the first rigid substrate 300 (a volume of this convex portion of the film 200 to be processed is the same as the volume of above concave portion of the film 200 to be processed, for example, the volume of this convex portion is substantially the same as the volume of the respective portion of the magnetic material pattern 120). At the same time, as the portion of the film 200 to be processed at a side thereof facing away from the first rigid substrate 300 is concave towards the first rigid substrate 300 and the portion of the film 200 to be processed at a side thereof facing towards the first rigid substrate 300 is convex towards the first rigid substrate 300, then, correspondingly, a portion of the flexible substrate 110 at a side thereof facing away from the first rigid substrate 300 is also concave towards the first rigid substrate 300 and a portion of the flexible substrate 110 at a side thereof facing towards the first rigid substrate 300 is also convex towards the first rigid substrate 300 (a volume of this concave portion of the flexible substrate 110 is substantially the same as the volume of the concave portion of the film 200 to be processed, and a volume of this convex portion of the flexible substrate 110 is substantially the same as the volume of the convex portion of the film 200 to be processed).

According to embodiments of the present disclosure, a specific type of the magnetic field applied to the magnetic substrate 100 is, for example, a uniform magnetic field. Therefore, a pushing force which is applied by the magnetic material pattern 120 onto the portion of the film 200 to be processed corresponding to the magnetic material pattern 120, via a magnetic effect of a magnetic field which is applied onto the magnetic substrate 120, (that is, a force which is applied by the magnetic material pattern 120 to push the portion of the film 200 to be processed corresponding to the magnetic material pattern 120 to project towards and to attach onto the first rigid substrate 300) may be set to be uniform in magnitude thereof, such that a pattern of the portion of the film 200 to be processed at a side thereof facing towards the first rigid substrate 300 which is convex towards the first rigid substrate 300 (a specific shape of the pattern of the convex portion is consistent with a pattern of the patterned film obtained in subsequent steps) has fine integrity, high quality, neat edge, flatness and accurate size; in other words, such that the patterned film obtained in subsequent step has fine integrity, high quality, neat edge, flatness and accurate size, and portion of the film 200 to be processed corresponding to the magnetic material pattern 120 has a high adhesion strength on the first rigid substrate 300.

According to embodiments of the present disclosure, an intensity of the magnetic field (i.e., a magnetic field strength) is for example flexibly selected, depending on the type and the thickness of the flexible substrate, the type and the thickness of the magnetic material, a binding force between the film to be processed and the first rigid substrate, and the like. In some specific embodiments of the disclosure, the specific magnitude of the intensity of the magnetic field may be selected in such a way that the force which is applied by the magnetic material pattern 120 to push the portion of the film 200 to be processed corresponding to the magnetic material pattern 120 to project towards and to attach onto the first rigid substrate 300 is moderate, and the adhesion strength of the portion of the film 200 to be processed corresponding to the magnetic material pattern 120 on the first rigid substrate 300 is sufficiently high (for example, substantially equivalent to the adhesion strength of the patterned film in a relevant method of patterning the film (comprising but not being limited to transferring), more specifically, e.g., not lower than the latter).

According to embodiments of the present disclosure, the magnetic field is applied to the magnetic substrate 100 in such a way that, for example, the magnetic material pattern 120 is placed in the magnetic field so that a force is generated near the magnetic material pattern 120 (i.e., in the vicinity of or in a peripheral area around the magnetic material pattern 120) in a direction perpendicularly pointing from the surfaces of the magnetic material pattern 120 towards the first rigid substrate to function as the aforementioned pushing force or thrust force, such that the portion of the film 200 to be processed corresponding to the magnetic material pattern 120 is pushed towards the first rigid substrate 300 and displaced, by the magnetic material pattern 120. In some embodiments of the present disclosure, a proper magnetic field may be generated for example by a permanent magnet, an electromagnet, and the like. Specifically, for example, the electromagnet is used to generate the magnetic field; as such, it may be easy to control application, removal of the magnetic field, and adjustment of the intensity of the magnetic field, and the like.

According to embodiments of the present disclosure, when the magnetic field is applied, for example, a way in which the magnetic field is slowly applied is adopted. In some embodiments of the present disclosure, for example, when the magnetic field is applied, the intensity of the magnetic field increases gradiently with a time as the magnetic field is applied or linearly with a time as the magnetic field is applied. In embodiments of the present disclosure, a specific changing mode in which the magnetic field is strengthened is for example specifically controlled, by a magnetic induction coil. As such, by slowly strengthening the magnetic field, it facilitates that the portion of the film 200 to be processed which is pushed towards the first rigid substrate 300 is separated from the magnetic substrate 100 slowly by an ever-changing thrust action of the pushing force, and in turn proceeds towards the first rigid substrate evenly and flush in pace, until it finally get in contact with and abuts against the first rigid substrate, such that the portion of the film 200 to be processed under the thrust action is separated, at a separation surface thereof which is flat, from the magnetic substrate 100.

According to the embodiment of the present disclosure, based on the force which is generated near the magnetic material pattern 120 (i.e., in the vicinity of or in the peripheral area around the magnetic material pattern 120) in the direction perpendicularly pointing from the surfaces of the magnetic material pattern 120 towards the first rigid substrate to function as the aforementioned thrust action, such that the adhesion force which is generated by attaching the portion of the film 200 to be processed corresponding to the magnetic material pattern 120 onto the first rigid substrate 300 is sufficient to ensure a firm attachment by adhesion.

According to the embodiment of the disclosure, in order to further increase the adhesion force between the film to be processed and the first rigid substrate, first active groups are provided at a surface of the film to be processed proximal to the first rigid substrate (i.e., a surface of the portion of the film to be processed under the thrust action to project, which surface faces towards the first rigid substrate 300), and second active groups are provided at a surface of the first rigid substrate proximal to the film to be processed, with an attraction effect existing between the first active groups and the second active groups. As such, by pushing the portion of the film 200 to be processed corresponding to the magnetic material pattern 120 to displace towards the first rigid substrate 300 until a distance between the film to be processed and the first rigid substrate is reduced to a certain range (e.g., below a threshold distance, which is an initial distance therebetween for respective active groups on the film to be processed and the first rigid substrate to start to attract each other), then a relatively strong attraction force may be created between the first active groups in the portion of the film to be processed corresponding to the magnetic material pattern (especially the portion of the film to be processed under the thrust action to project) and the second active groups in the first rigid substrate; while other portion of the film to be processed may not be pushed towards the first rigid substrate, without the thrust action applied thereon by the magnetic material pattern. As such, the attraction force between the first active groups in the portion of the film to be processed corresponding to the magnetic material pattern (especially the portion of the film to be processed under the thrust action to project) and the second active groups in the first rigid substrate further facilitate a separation of the portion of the film to be processed corresponding to the magnetic material pattern from other portion of the film to be processed, and the firm attachment of the portion of the film to be processed corresponding to the magnetic material pattern onto the first rigid substrate, by adhesion.

In some embodiments of the present disclosure, the material which forms the film 200 to be processed comprises quantum dots (i.e., a quantum dot material), and HMDS (hexamethyl-disilazane), PTS (toluene sulfonic acid), OTS (octadecyl trichlorosilane) and the like are used for pretreatment of the first rigid substrate 300. At that time, since there are a large number of long-chain active groups such as alkyl chains and aromatic groups and the like on respective surfaces of the film 200 to be processed and the first rigid substrate 300 to function as the first active groups and the second active groups, then, there is a relatively strong attraction effect between the film 200 to be processed and the first rigid substrate 300, and the attraction effect for example is much stronger than that between the film 200 to be processed and the flexible substrate 110 whose surfaces have siloxy groups (such as PDMS, PET, and the like), so as to ensure that the film 200 to be processed is tightly attached onto the first rigid substrate 300.

S400: forming a patterned film 201 on the first rigid substrate 300, by removing the magnetic field and removing both the magnetic substrate 100 and a portion of the film 200 to be processed which is not pushed to project towards the first rigid substrate. A structural schematic view of a structure generated in this step is illustrated in FIG. 2d.

According to embodiments of the present disclosure, when the magnetic field is being removed, for example, a way in which the magnetic field is being slowly removed is adopted. In some embodiments of the present disclosure, for example, when the magnetic field is being removed, the intensity of the magnetic field decreases gradiently with a time as the magnetic field is applied or linearly with a time as the magnetic field is applied. In embodiments of the present disclosure, a specific changing mode in which the magnetic field is reduced to zero is for example specifically controlled, by a magnetic induction coil. As such, by slowly weakening the magnetic field, it facilitates that the portion of the film 200 to be processed which is pushed to project towards the first rigid substrate 300 is separated slowly from both the magnetic substrate 100 and the other portion of the film 200 to be processed which is not pushed to project, by an ever-changing (i.e., gradually weakening) thrust action of the pushing force, such that the portion of the film 200 to be processed which is pushed to project is separated, at a separation surface thereof which is flat, from both the magnetic substrate 100 and the other portion of the film 200 to be processed which is not pushed to project, without any deterioration of morphology at the separation surface into roughness and unevenness (for example, there may exist sharp burrs and serrations and the like at the separation surface) due to tearing caused by a sharp separation therebetween.

According to embodiments of the present disclosure, when the magnetic field is being removed, after the portion of the film 200 to be processed corresponding to the magnetic material pattern 120 is pushed towards the first rigid substrate 300, and a relatively strong attraction force may be generated between the portion of the film 200 to be processed corresponding to the magnetic material pattern 120 which is pushed to project and the first rigid substrate 300;

and other portion of the film 200 to be processed is not pushed to project by the thrust action of the magnetic material pattern, i.e., it may not be pushed to project towards the first rigid substrate 300, and at this time may be removed by pulling apart the magnetic substrate 100 and the first rigid substrate 300 from each other. In doing so, the portion which is pushed to project in the portion of the film to be processed corresponding to the magnetic material pattern is separated from the other portion of the film 200 to be processed which is not pushed to project towards the first rigid substrate.

Figure 5:
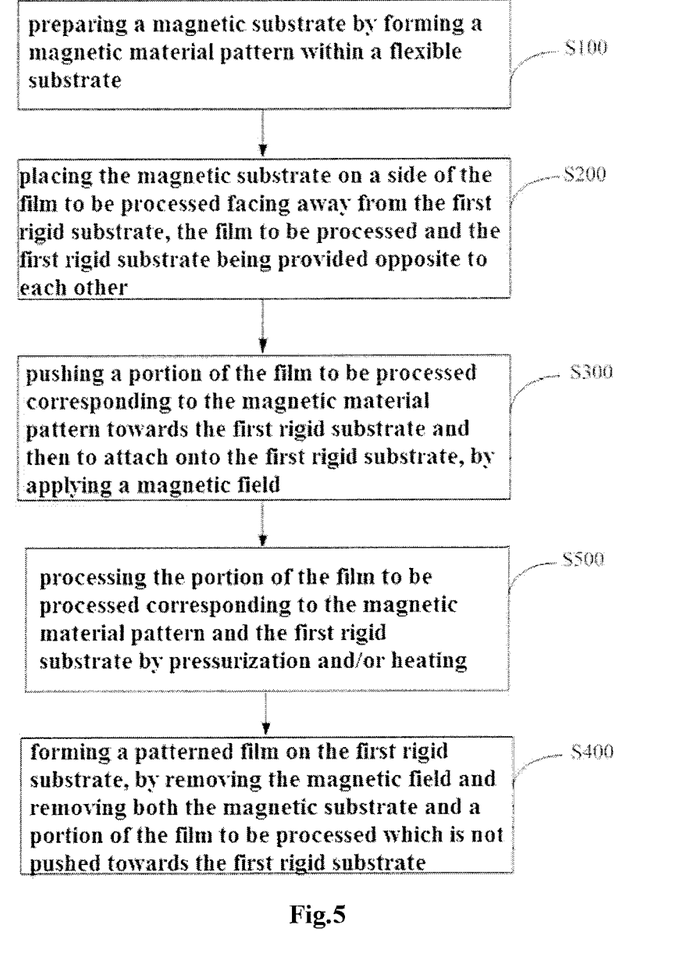
FIG. 5 illustrates a schematic flow chart of a method of patterning a film, according to some other embodiments of the disclosure.

In yet some other embodiments of the present disclosure, as illustrated in FIG. 5, prior to the removal of the magnetic substrate 100, the method for example additionally comprises:

S500: a step in which the portion of the film 200 to be processed corresponding to the magnetic material pattern 120 and the first rigid substrate 300 are processed by pressurization and/or heating.

According to embodiments of the present disclosure, the portion of the film 200 to be processed corresponding to the magnetic material pattern 120 and the first rigid substrate 300 are pressurized, for example, by controlling the intensity of the magnetic field such that the magnetic material pattern pressurizes the portion of the film 200 to be processed corresponding thereto. As such, the portion of the film 200 to be processed which is pushed towards the first rigid substrate 300 is further tightly and rapidly attached onto the first rigid substrate 300.

According to embodiments of the present disclosure, the portion of the film 200 to be processed corresponding to the magnetic material pattern 120 and the first rigid substrate 300 may be processed by heating at a temperature for example ranging between 60° C. and 180° C. In some specific embodiments of the present disclosure, the temperature at which the heating is implemented is, for example, 60° C., 80° C., 100° C., 120° C., 140° C., 160° C., or 180° C. As such, a chemical reaction between the surface of the film 200 to be processed and the groups on the surface of the first rigid substrate 300 is intensified at an elevated temperature, thereby intensifying generation of chemical bonds, facilitating that the portion of the film 200 to be processed which is pushed towards the first rigid substrate 300 is further tightly and rapidly attached onto the first rigid substrate 300.

In another aspect of embodiments of the present disclosure, a method of preparing a display device is provided in embodiments of the present disclosure. According to embodiments of the present disclosure, the method of preparing the display device comprises the steps of preparing the patterned film by the method of patterning the film as described above. It has been found that, as compared with the relevant art, embodiments of the present disclosure have the following beneficial effects: the method of preparing the display device is based on the magnetic force acting on the magnetic material and then pushing the material layer which forms the patterned film so as to obtain the convex pattern, thereby realizing the patterned film, and further facilitating the patterning based on a mutual attraction of the active groups. Therefore, it is simple, convenient in operation, and is easy to implement and is readily produced in industrialization, with a high yield and a high reliability. And the display device prepared by the method has a relatively high tonal purity, and a superior display effect. Moreover, the method of preparing the display device has all the features and advantages of the method of patterning the film described above, which will not be repeated too much herein.

According to embodiments of the present disclosure, it may be understood by those skilled in the art that, in addition to the steps of preparing the patterned film in the method of patterning the film as described previously, the method of preparing the display device also has other steps of a relevant method of preparing the display device, which will not be repeated too much herein.

According to embodiments of the present disclosure, the material which forms the patterned film 201 comprises quantum dots (i.e., a quantum dot material), and the patterned film forms a light-emitting layer or a color filter of the display device. In some embodiments, the patterned film forms the light-emitting layer of the display device, at that time, the display device is, for example, a display back plate; in some other embodiments, the patterned film forms the color filter of the display device, at that time, the display device is, for example, a color film substrate.

In yet another aspect of the embodiment of the present disclosure, a display device is provided in embodiments of the present disclosure. According to embodiments of the present disclosure, the display device is prepared by the method described above. It has been found that, as compared with the relevant art, the embodiments of the present disclosure have the following beneficial effects: the display device has a relatively high tonal purity, and a superior display effect.

According to embodiments of the present disclosure, the shape, structure, and the like of the display device are all, for example, any shape, structure, and the like in the relevant art. It may be understood by those skilled in the art that, in addition to the display panel as previously described, the display device has the structure of a display device in relevant art, and will not be repeated too much herein.

According to embodiments of the present disclosure, a specific type of the display device comprises structures or components (such as display back plate, color film substrate, display panel, etc.) forming the display device and the specific display device (such as mobile phone, tablet computer, game console, wearable device, television, and the like).

In the description of embodiments of the present disclosure, it is to be understood that oriental or positional relationships which are indicated by the terms "center", "longitudinal", "transverse", "length", "width", "thickness", "upper", "lower", "front", "back", "left", "right", "vertical", "horizontal", "top", "bottom", "inside", "outside", "clockwise", "counter clockwise", "axial", "radial", "circumferential" and the like are based on the oriental or positional relationships as shown in the drawings, only intending to facilitate depiction of embodiments of the disclosure and simplification of the description of the present disclosure, rather than indicating or implying that the device or element referred to must have a specific direction, be constructed and operated in a specific direction, therefore, they may not be understood as limitations of the embodiments of the present disclosure.

In addition, the terms "first", "second" are merely used for descriptive purposes and may not be understood as indicating or implying relative significance or implying the number of technical features as indicated. Therefore, a feature which is defined by "first" or "second" may explicitly or implicitly comprise one or more such features. In the description of embodiments of the present disclosure, expression "a plurality of" means two or more, unless specified otherwise definitely.

In embodiments of the present disclosure, unless expressly dictated and defined otherwise, the first feature "on" or "under" the second feature may mean that the first feature and the second feature are in direct contact with each other, or the first feature and the second feature are in indirect contact with each other through an intermediate medium. Moreover, the first feature is "on", "above" and "over" of the second feature may mean that the first feature is located immediately above or obliquely above the second feature, or merely mean that the level of the first feature is higher than the second feature. The first feature is "under", "below" and "beneath" the second feature may mean that the first feature is located immediately below or obliquely below the second feature, or merely mean that the level of the first feature is less than the second feature.

In the description of the present specification, the description referring to the terms "one embodiment", "some embodiments", "examples", "specific examples", or "some examples" may mean that the specific features, structures, materials or features described in combination with the embodiments or examples are contained in at least one embodiment or example of the embodiments of the present disclosure. In the specification, schematic expressions of the above terms do not have to be directed to the same embodiment or example. Moreover, the specific features, structures, materials or features described may be combined in an appropriate manner in any one or more embodiments or examples. In addition, without contradiction, different embodiments or examples described in the specification and features of different embodiments or examples may be combined by those skilled in the art.

Although the embodiments of the present disclosure have been illustrated and described above, it can be understood that the above embodiments are exemplary and may not be understood as restrictions on embodiments of the present disclosure. Various modifications and variation, replacement and transformation may be made to the embodiments of the present disclosure without departing from the scope of the embodiments of the present disclosure.

What is claimed is:

1. A method of patterning a film, comprising:
    preparing a magnetic substrate by forming a magnetic material pattern within a flexible substrate;
    disposing a film to be processed and a first rigid substrate opposite to and spaced apart from each other, and placing the magnetic substrate against a surface of the film to be processed at a side thereof facing away from the first rigid substrate;
    pushing a portion of the film to be processed corresponding to the magnetic material pattern to project towards and to attach onto the first rigid substrate, by the magnetic material pattern via a magnetic effect of a magnetic force of a magnetic field which is applied onto the magnetic substrate; and
    forming a patterned film on the first rigid substrate, by removing the magnetic field and removing both the magnetic substrate and a portion of the film to be processed which is not pushed to project towards the first rigid substrate.

2. The method according to claim 1, wherein forming the magnetic material pattern within the flexible substrate comprises:
    forming a first flexible film on a surface of a second rigid substrate at a side thereof;
    forming the magnetic material pattern on a surface of the first flexible film at a side thereof facing away from the second rigid substrate;
    forming a second flexible film on both a portion of the surface of the first flexible film at the side thereof facing away from the second rigid substrate which is not covered by the magnetic material pattern, and a portion of a surface of the magnetic material pattern at a side thereof facing away from the second rigid substrate, the second flexible film covering the magnetic material pattern; and
    peeling off the second rigid substrate from the first flexible film.

3. The method according to claim 1, wherein a material which forms the flexible substrate is selected from at least one of polydimethylsiloxane and polyethylene terephthalate.

4. The method according to claim 1, wherein a material which forms the magnetic material pattern is selected from at least one of iron, ferroalloy, iron containing compound, nickel, nickel alloy, cobalt, cobalt alloy, nickel containing compound or cobalt containing compound.

5. The method according to claim 1, wherein a material which forms the film to be processed is quantum dot material.

6. The method according to claim 1, wherein the magnetic field is a uniform magnetic field.

7. The method according to claim 1, wherein when the magnetic field is applied onto the magnetic substrate, a way in which an intensity of the magnetic field changes is one of following: the intensity of the magnetic field increases gradiently with a time as the magnetic field is applied, or the intensity of the magnetic field increases linearly with a time as the magnetic field is applied.

8. The method according to claim 1, wherein when the magnetic field is being removed, a way in which an intensity of the magnetic field changes is one of the following: the intensity of the magnetic field decreases with a time gradient of the magnetic field as applied, or the intensity of the magnetic field decreases linearly with a time as the magnetic field is applied.

9. The method according to claim 1, wherein first active groups are provided at a surface of the film to be processed proximal to the first rigid substrate, and second active groups are provided at a surface of the first rigid substrate proximal to the film to be processed; and
    in a condition that a distance between the film to be processed and the first rigid substrate is decreased below a threshold distance, an attraction effect exists between the first active groups and the second active groups.

10. The method according to claim 1, wherein prior to removal of the magnetic substrate, the method further comprises a step in which the portion of the film to be processed corresponding to the magnetic material pattern and the first rigid substrate are processed by at least one of pressurization and heating.

11. A method of preparing a display device, comprising steps of preparing a patterned film by using the method according to claim 1.

12. The method according to claim 11, wherein a material which forms the patterned film is quantum dot material, and the patterned film forms a light-emitting layer of the display device.

13. The method according to claim 11, wherein a material which forms the patterned film is quantum dot material, and the patterned film forms a color filter of the display device.

14. A display device, which is prepared by the method according to claim 11.

* * * * *